(12) United States Patent
Lu et al.

(10) Patent No.: US 7,615,796 B2
(45) Date of Patent: Nov. 10, 2009

(54) LIGHT EMITTING DIODE HAVING AN ELECTRODE BUFFER LAYER

(75) Inventors: Chih-Chiang Lu, Hsinchu (TW); Ling-Chin Huang, Hsinchu (TW); Jen-Shul Wang, Hsinchu (TW); Wen-Huang Liu, Hsinchu (TW); Min-Hsun Hsieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 11/256,400

(22) Filed: Oct. 19, 2005

(65) Prior Publication Data

US 2006/0091419 A1 May 4, 2006

(30) Foreign Application Priority Data

Nov. 3, 2004 (TW) ............... 93133411 A

(51) Int. Cl.
*H01L 33/00* (2006.01)
*H01L 27/15* (2006.01)

(52) U.S. Cl. ............... 257/98; 257/79; 257/97; 257/99; 257/100; 257/E33.028; 257/E33.043; 257/E33.063; 438/22; 438/47; 438/48

(58) Field of Classification Search ............ 257/79, 257/88, 99, 103, 97, 98, 100; 438/22, 46, 438/48, 698, 47
See application file for complete search history.

(56) References Cited

U.S. PATENT DOCUMENTS

| | | | | |
|---|---|---|---|---|
| 6,100,545 A | * | 8/2000 | Chiyo et al. | 257/98 |
| 6,255,648 B1 | * | 7/2001 | Littlejohn et al. | 250/286 |
| 6,649,440 B1 | * | 11/2003 | Krames et al. | 438/47 |
| 6,972,208 B2 | * | 12/2005 | Hsieh et al. | 438/48 |
| 7,015,513 B2 | * | 3/2006 | Hsieh | 257/99 |
| 2001/0005023 A1 | * | 6/2001 | Itoh et al. | 257/103 |
| 2002/0021266 A1 | * | 2/2002 | Koyama et al. | 345/76 |
| 2002/0136932 A1 | * | 9/2002 | Yoshida | 428/698 |
| 2003/0017633 A1 | * | 1/2003 | Doi et al. | 438/22 |
| 2003/0141508 A1 | * | 7/2003 | Okuyama et al. | 257/79 |
| 2003/0190764 A1 | * | 10/2003 | Lee et al. | 438/46 |
| 2004/0104393 A1 | | 6/2004 | Liu et al. | 257/79 |
| 2004/0149996 A1 | * | 8/2004 | Hsieh et al. | 257/88 |
| 2004/0164669 A1 | * | 8/2004 | Kawaguchi et al. | 313/501 |
| 2005/0056855 A1 | * | 3/2005 | Lin et al. | 257/98 |
| 2005/0077544 A1 | | 4/2005 | Liu et al. | 257/202 |

FOREIGN PATENT DOCUMENTS

JP 08-064908 3/1996

* cited by examiner

*Primary Examiner*—Dao H Nguyen
(74) *Attorney, Agent, or Firm*—J.C. Patents

(57) ABSTRACT

A light emitting diode (LED) utilizes an adhesive layer to adhere a light emitting layer to a substrate. The LED further comprises an electrode buffer layer to enhance the adhesion between the electrode and the light emitting diode, and thus to improve the yield rate of the LED.

21 Claims, 3 Drawing Sheets

LIGHT EMITTING DIODE HAVING AN ELECTRODE BUFFER LAYER

CROSS-REFERENCE TO RELATED APPLICATION

This application claims the priority benefit of Taiwan application serial no. 93133411, filed on Nov. 3, 2004. All disclosure of the Taiwan application is incorporated herein by reference. This application further claims the benefit of U.S. application Ser. No. 10/604,245, filed on Jul. 4, 2003 and U.S. application Ser. No. 11/160,588 filed on Jun. 29, 2005, which is a continuation-in-part application of application Ser. No. 10/604,245, filed on Jul. 4, 2003.

BACKGROUND OF THE INVENTION

1. Field of the Invention

The present invention generally relates to a light emitting diode (LED), and, in particular, to a wafer bonding type LED.

2. Description of the Related Art

Light emitting diodes (LEDs) have been employed in a wide variety of applications, including optical displays, traffic lights, data storage apparatuses, communication devices, illumination apparatuses, and medical treatment equipment. How to improve the yield rate of LEDs is an important issue in the manufacturing process of LEDs.

In United States Patent Publication No. 2005/0077544, an LED is disclosed. As shown in FIG. 1, a light emitting stack 13 of the LED is adhered to a substrate 10 through an adhesive layer 111. The LED further comprises a transparent conductive layer 121 disposed between the light emitting stack 13 and the adhesive layer 111. A portion of the transparent conductive layer 121 is exposed by an etching process, and an electrode 151 is formed on the exposed portion of the transparent conductive layer 121.

Regarding the above-mentioned manufacturing process of the LED, the material of the transparent conductive layer 121 is selected from indium tin oxide, cadmium tin oxide, and the like. The indium tin oxide is deposited on the surface of the light emitting stack by vapour deposition to form the transparent conductive layer 121. Next, a first reactive layer 101 is deposited, and then a reflection layer 141 is deposited on the substrate. A second reactive layer 102 is deposited on the reflection layer 141, and then the transparent conductive layer 121 disposed on the light emitting stack 13 is adhered to the second reactive layer 102 disposed on the substrate 10 through the adhesive layer 111. Thereafter, a portion of the light emitting stack is removed by an etching process to expose a first surface where the transparent conductive layer 121 contacts with the light emitting stack 13. The first surface is where the indium tin oxide is deposited. FIG. 2 is a picture of the first surface taken by SEM (scanning electron microscope). As shown in FIG. 2, the first surface is flat. FIG. 3 is a picture of the second surface where indium tin oxide contacts with the first reactive layer taken by SEM. As shown in FIG. 3, the second surface is rough. The first surface is where the electrode contacts. However, the first surface is flatter, and therefore the adhesion between the electrode and the first surface is not enough. The electrode is apt to peel off from the first surface, resulting a low yield rate of the LED.

Besides, the thickness between the electrode and the adhesive layer is not enough; therefore, the adhesive layer can be damaged due to the stress generated during the following wire bonding process. Thus, the yield rate of the LED is low.

SUMMARY OF THE INVENTION

Accordingly, the present invention is to provide an LED, which utilizes an electrode buffer layer to solve the problem that the electrode peels off from the transparent conductive layer during a wire bonding process.

As embodied and broadly described herein, the present invention provides an LED comprising a substrate, an adhesive layer, a conductive layer, a light emitting stack, an electrode buffer layer, a first electrode, and a second electrode. The adhesive layer is disposed on the substrate. The conductive layer is disposed on the adhesive layer, wherein the conductive layer has an upper surface and a lower surface, the distance between the upper surface and the substrate is greater than that between the lower surface and the substrate, and the upper surface has a first surface region, a second surface region and, a third surface region. The light emitting stack is disposed on the first surface region. The electrode buffer layer is disposed on the second surface region. The first electrode is disposed on the electrode buffer layer, extends downwardly toward the conductive layer, and contacts with the third surface region of the conductive layer. The second electrode is disposed on the light emitting stack. The adhesion between the first electrode and the electrode buffer layer is good, and the contact between the electrode and the conductive layer is good. When current from the first electrode travels to the conductive layer, an electrical connection between the first electrode, the light emitting stack, and the second electrode is generated due to the good carrier mobility of the conductive layer.

According to an embodiment of the present invention, the substrate comprises at least one material selected from the group consisting of Si, GaAs, SiC, sapphire, glass, quartz, GaP, and metal.

According to an embodiment of the present invention, the adhesive layer comprises at least one material selected from the group consisting of polyimide (PI), benzocyclobutene (BCB), prefluorocyclobutane (PFCB), and metal.

According to an embodiment of the present invention, the conductive layer comprises at least one material selected from the group consisting of indium tin oxide, cadmium tin oxide, antinomy tin oxide, zinc oxide, zinc tin oxide, metal, and semiconductor material.

According to an embodiment of the present invention, the light emitting stack comprises a first semiconductor stack, a light emitting layer, and a second semiconductor stack. The light emitting layer is disposed on the first semiconductor stack, and the second semiconductor stack is disposed on the light emitting layer.

According to an embodiment of the present invention, the electrode buffer layer comprises a semiconductor stack. The semiconductor stack comprises at least one material selected from the group consisting of AlInP, AlGaInP, GaP, GaN, AlGaN, InGaN, and AlInGaN.

According to an embodiment of the present invention, the electrode buffer layer comprises a polymer material.

According to an embodiment of the present invention, the first electrode comprises at least one material selected from the group consisting of Cr/Au, Ni/Au, Cr/Al, Ti/Al, and Ti/Au.

According to an embodiment of the present invention, the second electrode comprises at least one material selected from the group consisting of Cr/Au, Ni/Au, Cr/Al, Ti/Al, and Ti/Au.

According to an embodiment of the present invention, the LED further comprises a second conductive layer disposed between the electrode buffer layer and the electrode. The second conductive layer comprises at least one material selected from the group consisting of indium tin oxide, cadmium tin oxide, antinomy tin oxide, zinc oxide, zinc tin oxide, metal, and semiconductor material.

The LED utilizes an electrode buffer layer disposed between the transparent conductive layer and the electrode for bonding wire. Because the adhesion between the electrode and the electrode buffer layer is good, therefore, the problem that the electrode is apt to peel off from the transparent conductive layer can be resolved. Furthermore, in the following wire bonding process, the electrode buffer layer serves as a stress buffer layer to solve the problem of cracked adhesive layer due to the stress generated during wire bonding process. Thus, the yield rate of the LED can be enhanced.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE EMBODIMENTS

Figure 1:
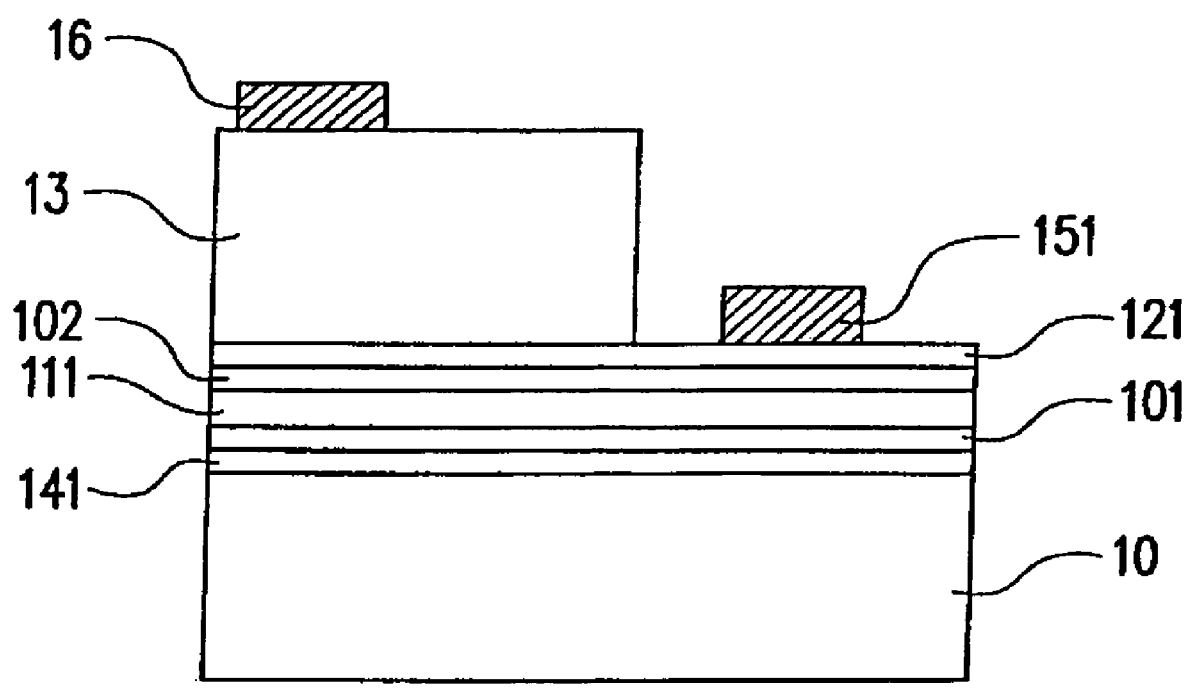
FIG. 1 is a schematic cross-sectional view illustrating a conventional LED.
Figure 2:
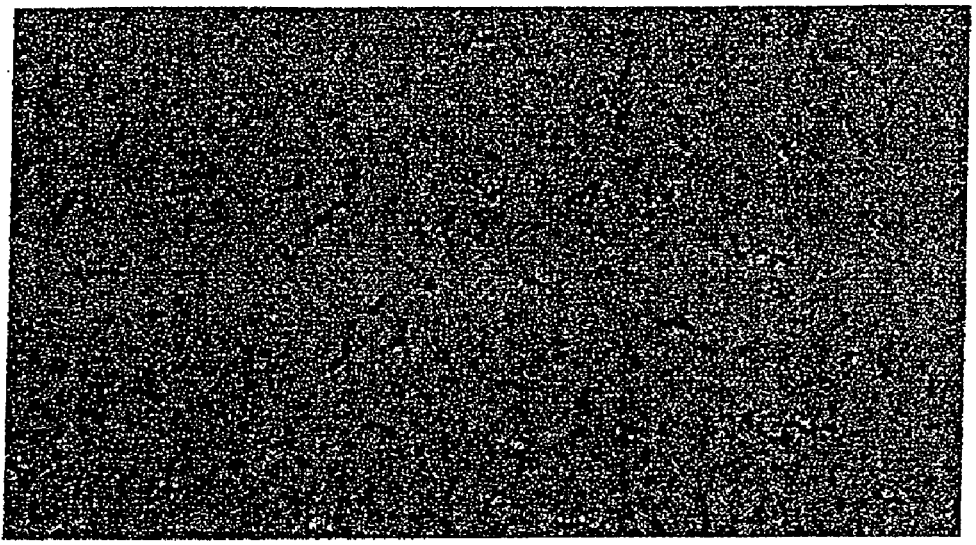
FIG. 2 is a picture of the first surface taken by SEM.
Figure 3:
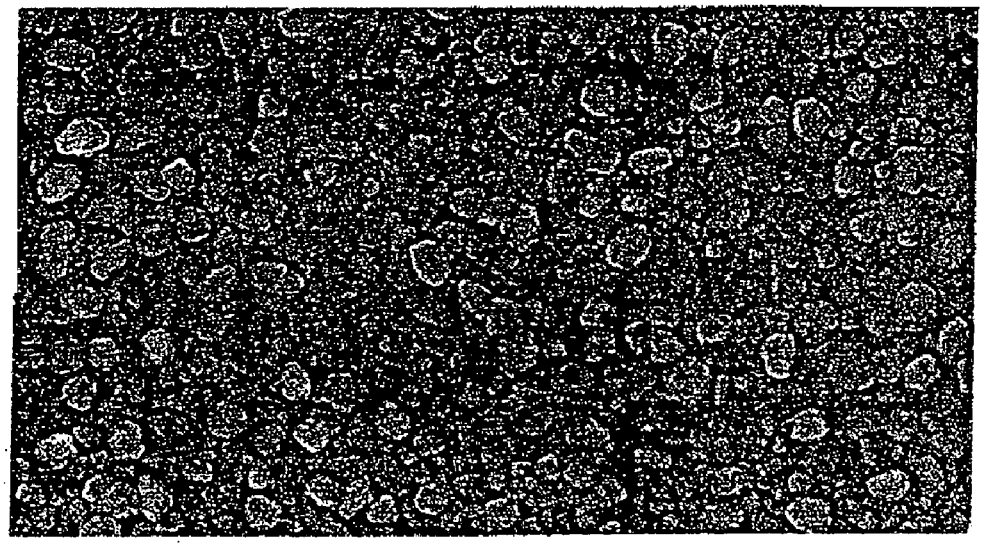
FIG. 3 is a picture of the second surface where indium tin oxide contacts with the first reactive layer taken by SEM.

Reference will now be made in detail to the preferred embodiments of the present invention, examples of which are illustrated in the accompanying drawings. Wherever possible, the same reference numbers are used in the drawings and the description to refer to the same or like parts.

Figure 4:
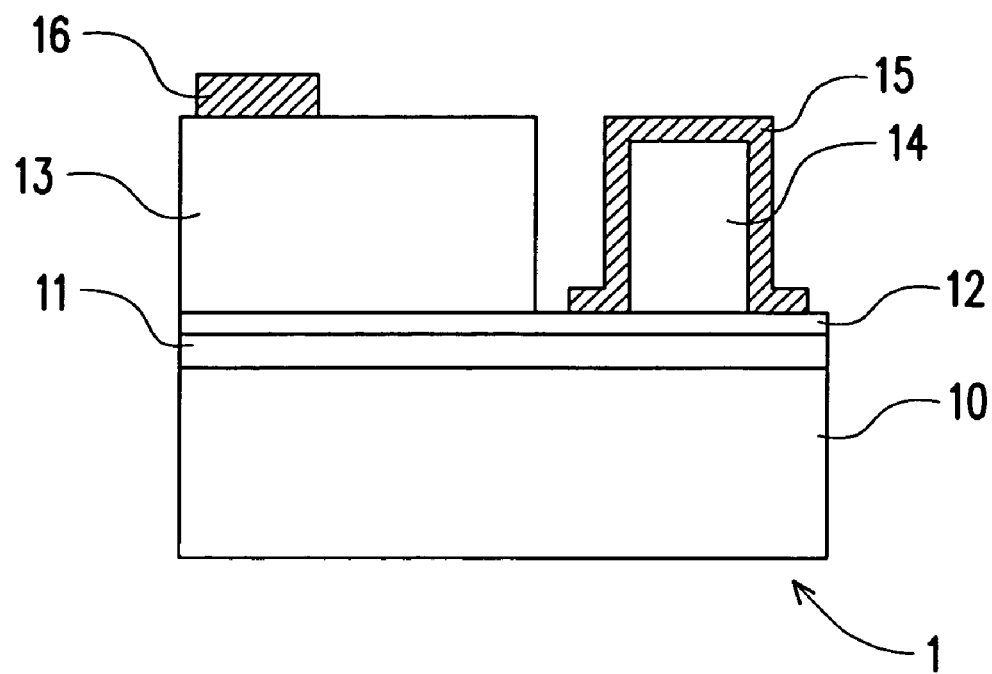
FIG. 4 is a schematic cross-sectional view illustrating an LED in accordance with a preferred embodiment of the present invention.

Referring to FIG. 4, the LED 1 of the present invention comprises a substrate 10, an adhesive layer 11, a conductive layer 12, a light emitting stack 13, an electrode buffer layer 14, a first electrode 15 and, a second electrode 16. The adhesive layer 11 is disposed on the substrate 10. The conductive layer 12 is disposed on the adhesive layer 11, wherein the conductive layer 12 has an upper surface and a lower surface, the distance between the upper surface and the substrate is greater than that between the lower surface and the substrate, and the upper surface has a first surface region, a second surface region, and a third surface region. The light emitting stack 13 is disposed on the first surface region. The electrode buffer layer 14 is disposed on the second surface region. The first electrode 15 is disposed on the electrode buffer layer 14, extends downwardly toward the conductive layer 12, and contacts with the third surface region of the conductive layer 12. The second electrode 16 is disposed on the light emitting stack 13.

Figure 5:
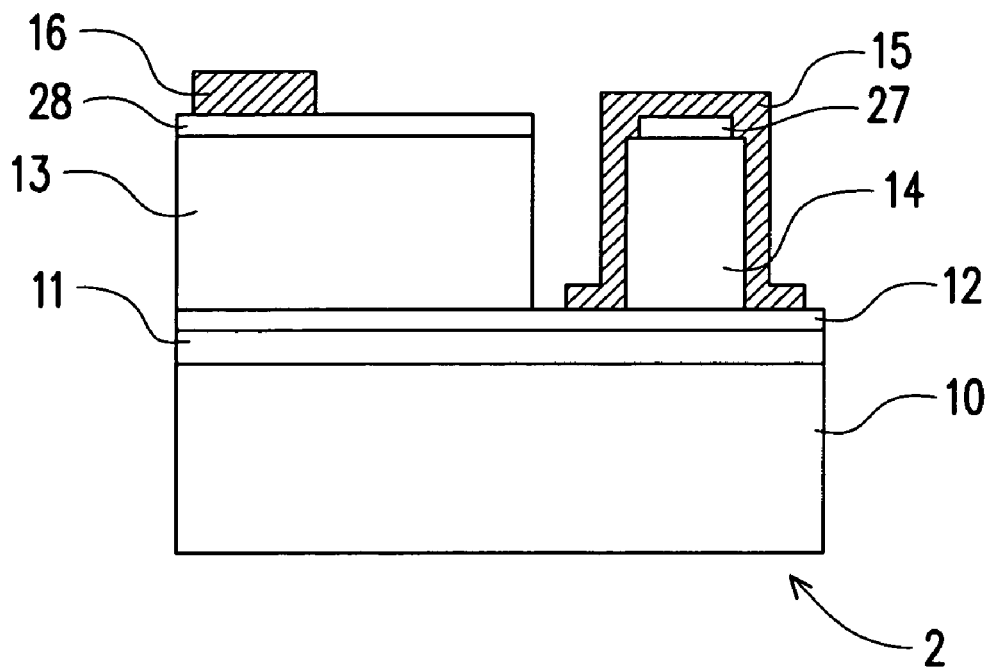
FIG. 5 is a schematic cross-sectional view showing an LED in accordance with another preferred embodiment of the present invention.

Referring to FIG. 5, the LED 2 is similar to the LED 1 as shown in FIG. 1. But the difference between them is that the LED 2 further comprises a second conductive layer 27 and a third conductive layer 28, both for current spreading. The second conductive layer 27 is disposed between the electrode buffer layer 14 and the first electrode 15, and the third conductive layer 28 is disposed between the light emitting stack 13 and the second electrode 16.

The above-mentioned light emitting stack 13 comprises a first semiconductor stack, a light emitting layer and a second semiconductor stack. The light emitting layer is disposed on the first semiconductor stack. The second semiconductor stack is disposed on the light emitting layer.

The above-mentioned LED further comprises a first reactive layer disposed between the substrate and the adhesive layer. The above-mentioned LED further comprises a second reactive layer disposed between the conductive layer and the adhesive layer to increase the adhesion.

In the above-mentioned LED, the electrode buffer layer 14 is composed of a semiconductor stack or a polymer material.

In the LED of the present invention, the substrate 10 comprises at least one material selected from the group consisting of Si, GaAs, SiC, sapphire, glass, quartz, GaP, and metal.

In the above-mentioned LED, the adhesive layer 11 comprises at least one material selected from the group consisting of polyimide (PI), benzocyclobutene (BCB), prefluorocyclobutane (PFCB), and metal.

The LED utilizes an electrode buffer layer disposed between the transparent conductive layer and the electrode for bonding wire. Because the adhesion between the electrode and the electrode buffer layer is good, and, therefore, the problem that the electrode is apt to peel off from the transparent conductive layer can be resolved. Furthermore, in the following wire bonding process, the electrode buffer layer serves as a stress buffer layer to solve the problem of cracked adhesive layer due to the stress generated during wire bonding process. Thus, the yield rate of the LED can be enhanced.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A light emitting diode, comprising:
a substrate;
an adhesive layer disposed on the substrate;
a conductive layer disposed on the adhesive layer, wherein the conductive layer has an upper surface and a lower surface, the distance between the upper surface and the substrate is greater than that between the lower surface and the substrate, and the upper surface has a first surface region, a second surface region, and a third surface region;
a light emitting stack disposed on the first surface region, wherein the light emitting stack comprises:
a first semiconductor stack;
a light emitting layer on the first semiconductor stack; and
a second semiconductor stack on the light emitting layer, and wherein the first semiconductor stack and the conductive layer is distinguishable;
an electrode buffer layer disposed on the second surface region;
a first electrode conformably formed around the electrode buffer layer, the first electrode extending downward and being in direct contact with the conductive layer in the third surface region; and
a second electrode disposed on the light emitting stack.

2. The light emitting diode according to claim 1, wherein the substrate comprises at least one material selected from the group consisting of Si, GaAs, SiC, sapphire, glass, quartz, GaP, and metal.

3. The light emitting diode according to claim 1, wherein the adhesive layer comprises at least one material selected from the group consisting of polyimide, benzocyclobutane, and prefluorocyclobutane.

4. The light emitting diode according to claim 1, wherein the conductive layer comprises at least one material selected from the group consisting of indium tin oxide, cadmium tin oxide, antinomy tin oxide, zinc oxide, and zinc tin oxide.

5. The light emitting diode according to claim 1, wherein the electrode buffer layer comprises a semiconductor stack.

6. The light emitting diode according to claim 5, wherein the semiconductor stack comprises at least one material selected from the group consisting of AlInP, AlGaInP, GaP, GaN, AlGaN, InGaN, and AlInGaN.

7. The light emitting diode according to claim 1, wherein the electrode buffer layer comprises a polymer material.

8. The light emitting diode according to claim 7, wherein the polymer material comprises benzocyclobutane or SU8.

9. The light emitting diode according to claim 1, wherein the electrode comprises at least one material selected from the group consisting of Cr/Au, Ni/Au, Cr/Al, Ti/Al, and Ti/Au.

10. The light emitting diode according to claim 1, wherein the second electrode comprises at least one material selected from the group consisting of Cr/Au, Ni/Au, Cr/Al, Ti/Al, and Ti/Au.

11. The light emitting diode according to claim 1, further comprising a third conductive layer disposed between the light emitting stack and the second electrode.

12. The light emitting diode according to claim 11, wherein the third conductive layer comprises at least one material selected from the group consisting of indium tin oxide, cadmium tin oxide, antinomy tin oxide, zinc oxide, zinc tin oxide, metal, and semiconductor material.

13. The light emitting diode according to claim 1, further comprising a second conductive layer disposed between the electrode buffer layer and the first electrode.

14. The light emitting diode according to claim 13, wherein the second conductive layer comprises at least one material selected from the group consisting of indium tin oxide, cadmium tin oxide, antinomy tin oxide, zinc oxide, zinc tin oxide, metal, and semiconductor material.

15. The light emitting diode according to claim 1, further comprising a first reactive layer between the substrate and the adhesive layer.

16. The light emitting diode according to claim 15, wherein the first reactive layer comprises at least one material selected from the group consisting of $SiN_x$, Ti, and Cr.

17. The light emitting diode according to claim 1, further comprising a second reactive layer between the conductive layer and the adhesive layer.

18. The light emitting diode according to claim 7, wherein the second reactive layer comprises at least one material selected from the group consisting of $SiN_x$, Ti, and Cr.

19. The light emitting diode according to claim 1, wherein the heights of the first electrode and the second electrode are substantially the same.

20. The light emitting diode according to claim 1, wherein the conductive layer comprises metal.

21. The light emitting diode according to claim 1, wherein the adhesive layer comprises metal.

* * * * *